(12) United States Patent
Lee et al.

(10) Patent No.: US 12,256,618 B2
(45) Date of Patent: Mar. 18, 2025

(54) DISPLAY DEVICE

(71) Applicant: Samsung Display Co., Ltd., Yongin-si (KR)

(72) Inventors: Kyunghee Lee, Suwon-si (KR); Mihwa Lee, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 808 days.

(21) Appl. No.: 17/391,154

(22) Filed: Aug. 2, 2021

(65) Prior Publication Data

US 2022/0069016 A1 Mar. 3, 2022

(30) Foreign Application Priority Data

Aug. 26, 2020 (KR) .................. 10-2020-0107503

(51) Int. Cl.
*H10K 59/38* (2023.01)

(52) U.S. Cl.
CPC .................... *H10K 59/38* (2023.02)

(58) Field of Classification Search
CPC ........................................... H10K 59/38
USPC ............................................ 349/106
See application file for complete search history.

(56) References Cited

U.S. PATENT DOCUMENTS

| | | | |
|---|---|---|---|
| 5,282,894 A * | 2/1994 | Albert | .................. C09D 11/037 106/31.43 |
| 9,090,776 B2 | 7/2015 | Steppel et al. | |
| 9,971,191 B2 | 5/2018 | Cho et al. | |
| 10,247,980 B2 | 4/2019 | Cho et al. | |
| 10,529,899 B2 | 1/2020 | Sato et al. | |
| 10,746,377 B2 | 8/2020 | Palmer et al. | |
| 10,871,677 B2 | 12/2020 | Lee et al. | |
| 2014/0103635 A1* | 4/2014 | Lehmann | ................ C07F 15/00 283/85 |
| 2020/0073169 A1 | 3/2020 | Jung et al. | |
| 2023/0303608 A1* | 9/2023 | Reichert | ............... C07F 15/045 |

FOREIGN PATENT DOCUMENTS

| | | |
|---|---|---|
| KR | 10-1740429 | 5/2017 |
| KR | 10-1746722 | 6/2017 |
| KR | 10-1799975 | 11/2017 |
| KR | 10-1842495 | 3/2018 |
| KR | 10-1948822 | 2/2019 |
| KR | 10-2074898 | 2/2020 |
| KR | 10-2020-0027109 | 3/2020 |
| KR | 10-2020-0042474 | 4/2020 |

OTHER PUBLICATIONS

Lee et al., "Synthesis of Bis(dithiobenzil) Metal Complex and Its Photostability", J. Korean Ind. Eng. Chem., Oct. 2007, pp. 433-437, Total 5 pages, vol. 18, No. 5.

* cited by examiner

*Primary Examiner* — Christopher M Raabe
(74) *Attorney, Agent, or Firm* — KILE PARK REED & HOUTTEMAN PLLC

(57) ABSTRACT

A display device includes: a display panel including a light-emitting element to provide a first light; a light control layer disposed on the display panel; and a color correction layer disposed on the light control layer, wherein the color correction layer includes an organic dye and a metal compound including at least one dithiolene moiety, a maximum absorption wavelength of the organic dye is about 580 nm to about 600 nm, and a maximum absorption wavelength of the metal compound is about 700 nm or more.

21 Claims, 7 Drawing Sheets

DISPLAY DEVICE

CROSS-REFERENCE TO RELATED APPLICATIONS

This application claims priority from and the benefit of Korean Patent Application No. 10-2020-0107503, filed on Aug. 26, 2020, which is hereby incorporated by reference for all purposes as if fully set forth herein.

BACKGROUND

Field

Embodiments of the invention relate generally to a display device and, more specifically, to a display device with an improved color gamut.

Discussion of the Background

Various display devices used in a multimedia device such as a television, a mobile phone, a tablet computer, and a game console have been developed. A display device may include various optical functional layers to provide a color image of excellent quality to a user.

Various forms of display devices, such as a display device including a curved surface, a rollable display device, or a foldable display device, have been recently developed.

The above information disclosed in this Background section is only for understanding of the background of the inventive concepts, and, therefore, it may contain information that does not constitute prior art.

SUMMARY

With the introduction of curved, rollable, and flexible display devices, Applicant recognized the need for thinner display devices having improved color gamut.

Display devices constructed according to the principles and illustrative implementations of the invention have with improved color gamut and reliability.

For example, a color correction layer included in display devices constructed according to the principles and embodiments of the invention may include an organic dye and a dithiolene-based metal compound. The color correction layer may include an organic dye having a maximum absorption wavelength range longer than a peak wavelength of green light and shorter than a peak wavelength of red light to improve a color gamut of the display device. The color correction layer may include a dithiolene-based metal compound which serves as a light stabilizer, so that the effect of improving the color gamut may be maintained even if the display device is exposed to light for a long time. In addition, a maximum absorption wavelength range of the dithiolene-based metal compound may be included in the near-infrared region, which is a longer wavelength than the peak wavelength of red light, and thus, the dithiolene-based metal compound may serve as a light stabilizer without affecting light absorption in the visible light region. That is, the dithiolene-based metal compound may not reduce the color gamut of an image provided by the display device.

Additional features of the inventive concepts will be set forth in the description which follows, and in part will be apparent from the description, or may be learned by practice of the inventive concepts.

According to one aspect of the invention, a display device includes: a display panel including a light-emitting element to provide a first light; a light control layer disposed on the display panel; and a color correction layer disposed on the light control layer, wherein the color correction layer includes an organic dye and a metal compound including at least one dithiolene moiety, a maximum absorption wavelength of the organic dye is about 580 nm to about 600 nm, and a maximum absorption wavelength of the metal compound is about 700 nm or more.

The maximum absorption wavelength range of the organic dye may not overlap the maximum absorption wavelength range of the metal compound.

The light transmittance of the color correction layer may be about 0.6 or less at a wavelength of about 580 nm to about 600 nm.

The molar extinction coefficient at the maximum absorption wavelength of the organic dye may be about 10,000 $M^{-1}cm^{-1}$ or more.

The content of the metal compound including a dithiolene-based metal compound may be less than a content of the organic dye in the color correction layer.

The organic dye may be included in an amount of about 0.1 wt % to about 10 wt %, based on a total weight of the color correction layer.

The metal compound may be included in an amount of about 0.1 wt % to about 5 wt %, based on a total weight of a color correction layer.

The organic dye may include at least one compound including a squarylium moiety.

The metal compound may include at least one bis(dithiobenzil) nickel-based compound.

The light-emitting element including an organic light-emitting element, a nano light-emitting element, or a quantum dot light-emitting element.

The light control layer may include a first light control portion including a first quantum dot to convert the first light into a second light having a different wavelength range; a second light control portion including a second quantum dot to convert the first light into a third light having a different wavelength range; and a transmissive portion to transmit the first light.

A scatterer in at least one of the first light control portion, the second light control portion, and the transmissive portion.

The display panel may include a flexible display panel.

According to another aspect of the invention, a display device includes: a light-emitting element layer to provide blue light; a light control layer disposed on the light-emitting element layer; and a color correction layer disposed on the light control layer, wherein the light control layer includes a first light control layer including a first quantum dot to convert the blue light to green light; a second light control layer including a second quantum dot to convert the blue light to red light; and a transmitter to transmit the blue light, and the color correction layer includes an organic dye and a metal compound including at least one dithiolene moiety, wherein a maximum absorption wavelength of the organic dye is longer than a peak wavelength of the green light, and a maximum absorption wavelength of the metal compound is longer than a peak wavelength of the red light.

The maximum absorption wavelength range of the organic dye may not overlap the maximum absorption wavelength range of the metal compound.

The maximum absorption wavelength of the organic dye may be longer than the peak wavelength of the green light and shorter than the peak wavelength of the red light.

The molar extinction coefficient at the maximum absorption wavelength of the organic dye may be about 10,000 $M^{-1}cm^{-1}$ or more.

The content of the metal compound may be about 50% or less of a content of the organic dye in the color correction layer.

The organic dye may be included in an amount of about 0.1 wt % to about 10 wt % and the metal compound may be included in an amount of about 0.1 wt % to about 5 wt %, based on a total weight of the color correction layer.

The organic dye may include at least one squarylium-based compound, and the metal compound may include at least one bis(dithiobenzil) nickel-based compound.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
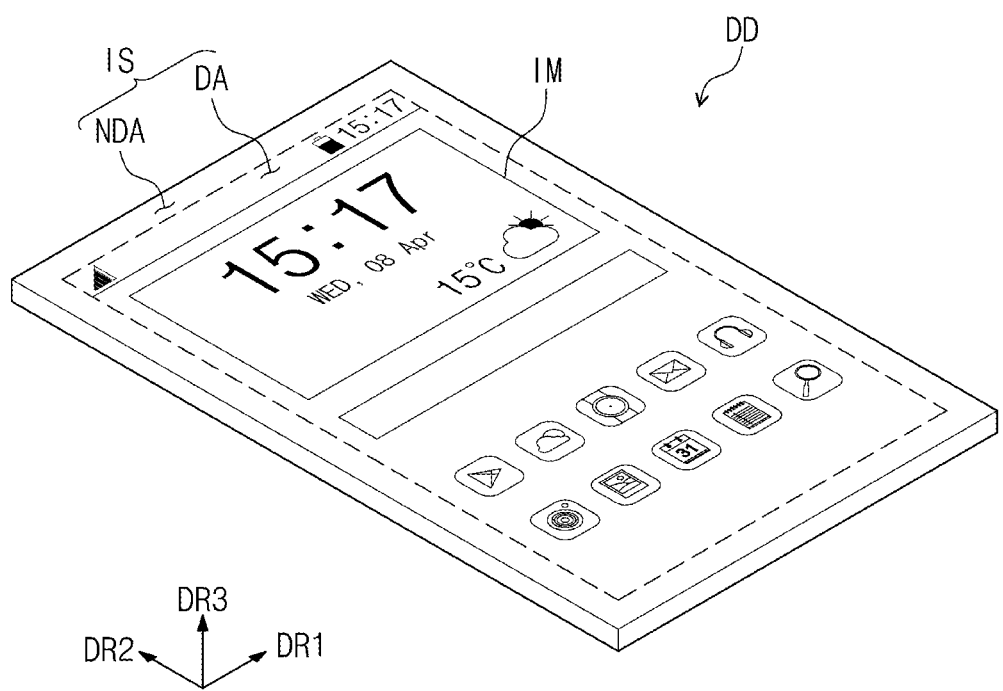
FIG. 1 is a perspective view illustrating an embodiment of a display device constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, parts, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, parts, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

The terms "metal" and "nickel" refer to their respective atoms and corresponding radicals.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view illustrating an embodiment of a display device constructed according to principles of the invention. FIG. 1 illustrates by way of example a portable electronic device as a display device DD. However, the display device DD may be used in a large electronic devices such as a television, a monitor, or an external billboard, as well as a small and medium-sized electronic device such as a personal computer, a notebook computer, a personal digital assistant, a car navigation unit, a game console, a smart phone, a tablet, and a camera. Also, these are presented by way of example only, and the display device DD may be applied to or in the form of other electronic devices.

The display device DD may have a generally hexahedral shape having a thickness in a direction of the third direction axis DR3 on the plane defined by a first direction axis DR1 and a second direction axis DR2 intersecting each other. However, this is illustrated by way of example. The display device DD may have various shapes and is not limited to any one of the particular shapes or embodiments disclosed herein.

In an embodiment, an upper surface (or front surface) and a lower surface (or rear surface) of each of members are defined based on the direction in which an image IM is displayed. The upper and lower surfaces may be opposed to each other in the direction of the third direction axis DR3, and a normal direction of each of the upper and lower surfaces may be generally parallel to the direction of the third direction axis DR3.

The directions indicated by the first to third direction axes DR1, DR2, DR3 are relative concepts and may be converted into different directions. Hereinafter, the first to third directions refer to the same reference numerals as directions indicated by the first to third direction axes DR1, DR2, and DR3, respectively.

The display device DD may display the image IM through a display surface IS. The display surface IS includes a display region DA wherein the image IM is displayed and a non-display region NDA adjacent to the display region DA. The non-display region NDA is a region wherein no image is displayed. The image IM may be a dynamic image or a static image. FIG. 1 illustrates a plurality of application icons, a clock, and so on as an example of the image IM.

The display region DA may have a generally rectangular shape. The non-display region NDA may surround the display region DA. However, this is illustrated by way of example, and the shape of the display region DA and the non-display region NDA may be relatively designed in other ways. In addition, there may be no non-display region NDA on the front surface of the display device DD.

The display device DD may be flexible. This means it has properties that enabling bending, which may include all structures from a structure that can be completely folded to a structure that can be bent to several nanometers scale. For example, the display device DD may be a generally curved display device or a foldable display device. However, the embodiments are not limited thereto, and the display device DD may be rigid.

Figure 2:
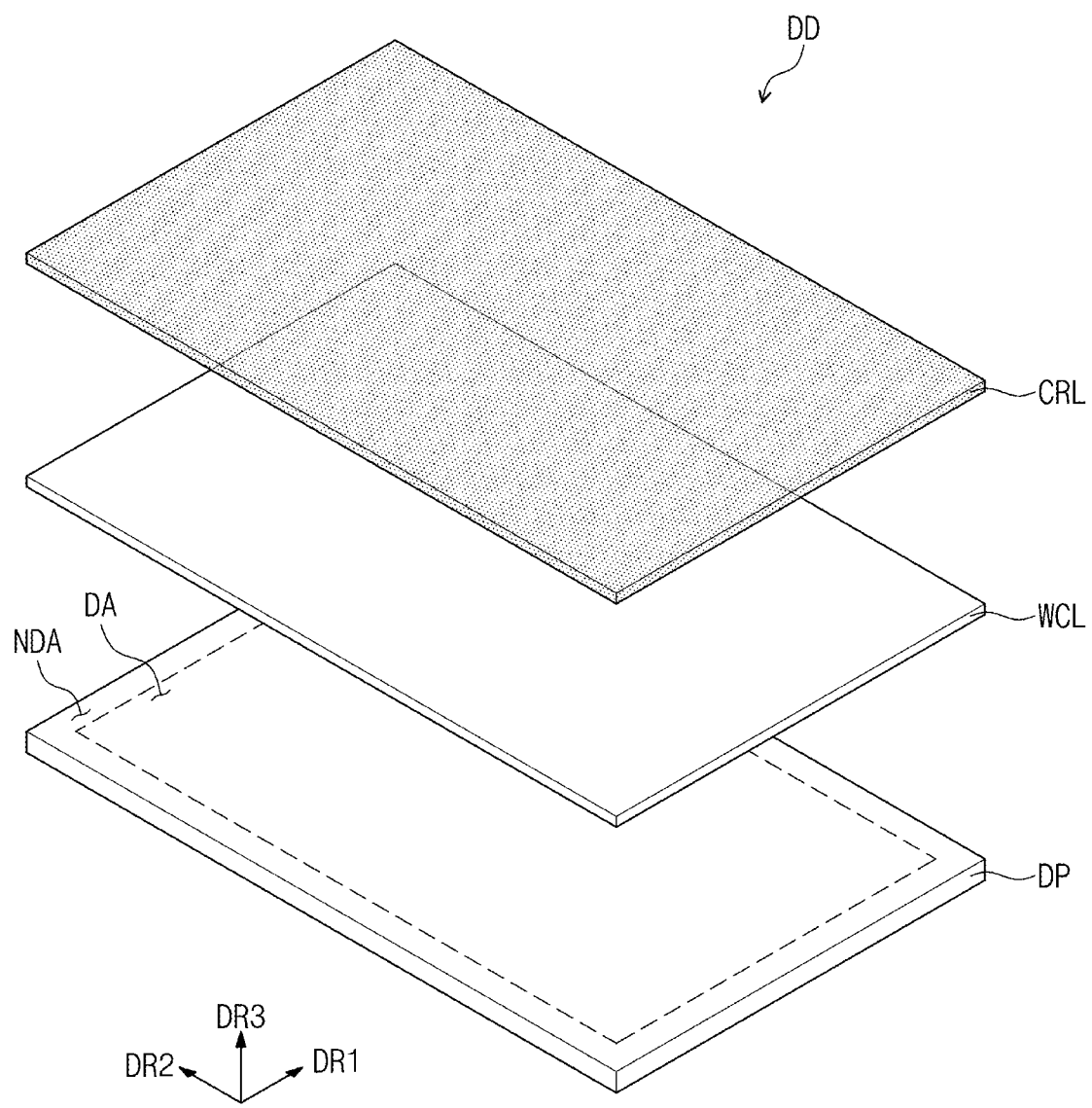
FIG. 2 is an exploded perspective view of the display device of FIG. 1.

FIG. 2 is an exploded perspective view of the display device of FIG. 1. Referring to FIG. 2, the display device DD may include a display panel DP, a light control layer WCL, and a color correction layer CRL that are sequentially stacked along the third direction DR3.

The display panel DP may include a plurality of pixels in a region corresponding to the display region DA of the display device DD. The plurality of pixels may correspond to a plurality of light-emitting regions PXA-R, PXA-B, and PXA-G (refer to FIG. 3). The plurality of pixels may display light according to an electrical signal. With the plurality of pixels, the display region DA may display an image IM generated by light.

A display panel DP may be a light-emitting display panel. For example, the display panel DP may be a liquid crystal display panel, a micro LED display panel, a nano LED display panel, an organic light-emitting display panel, or a quantum dot light-emitting display panel. However, the display panel DP is not limited to the above examples.

An emission layer of the organic light-emitting display panel may include an organic light-emitting material. An emission layer of a quantum dot light-emitting display panel may include a quantum dot and/or a quantum rod, etc. The micro LED display panel may include a micro light-emitting diode element, which is an ultra-small light-emitting element, and the nano LED display panel may include a nano light-emitting diode element. Hereinafter, the display panel DP is described as an organic light-emitting display panel.

The light control layer WCL may be disposed on the display panel DP. The light control layer WCL may transmit a light source output from the display panel DP or convert it into a light having a different wavelength to output light of various colors.

The color correction layer CRL may be disposed on the light control layer WCL. The color correction layer CRL may correct the color of various light output from the light control layer WCL. The light passing through the color correction layer CRL has an improved color gamut, which may provide clear and close to nature colors to a user. In addition, the color correction layer CRL may cover front surfaces of the display panel DP and the light control layer WCL to protect the display panel DP and the light control layer WCL.

The display device DD may further include a light control auxiliary layer between the light control layer WCL and the color correction layer CRL. The light control auxiliary layer may reflect some of the light transmitted through the light control layer WCL back to the light control layer WCL. A portion of the light source output from the display panel DP needs to be converted into a light having a wavelength range different from that of the output light source, depending on the displayed region. However, light whose wavelength range may not be converted while passing through the light control layer WCL may be present, and the light control auxiliary layer may return such light to the light control layer WCL so that light conversion efficiency of the light control layer WCL may increase. For example, the light control auxiliary layer may include a material having a lower refractive index or a transflective material to reflect light that has passed through the light control layer WCL back to the light control layer WCL.

Figure 3:
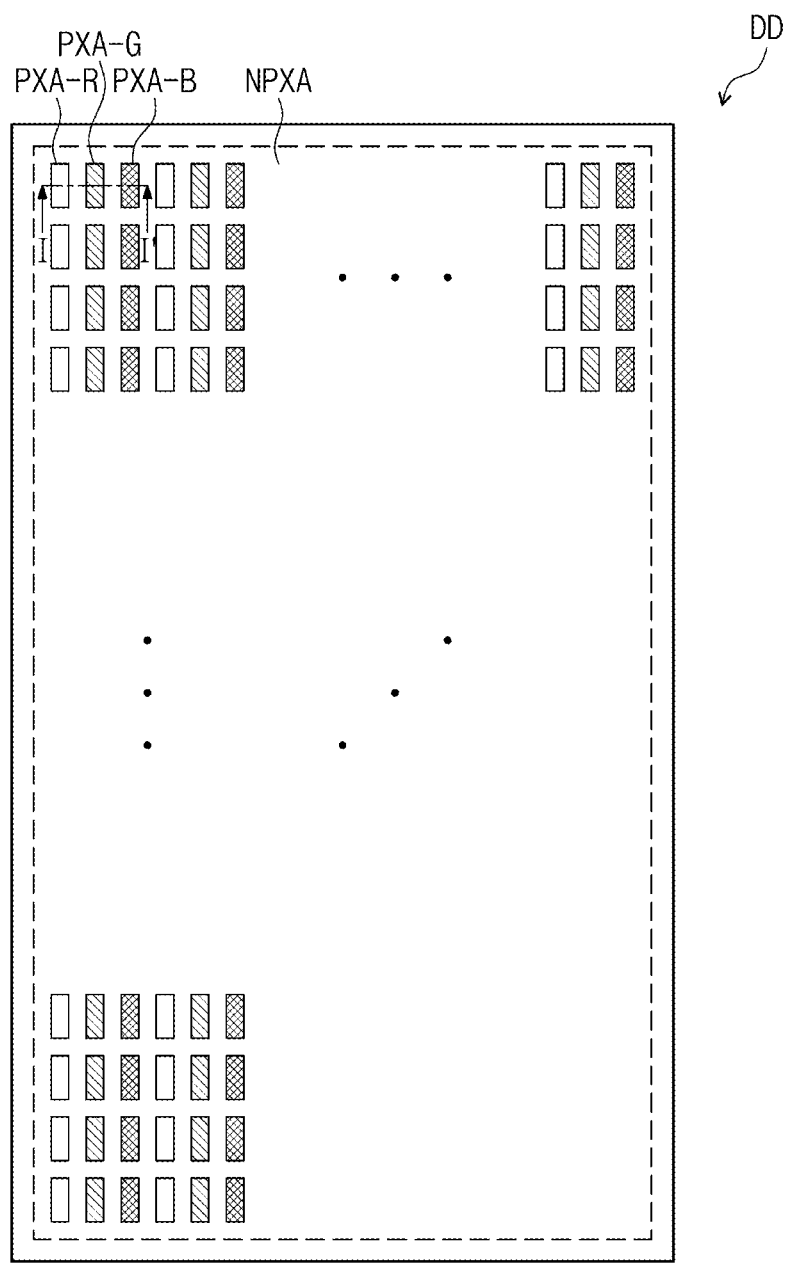
FIG. 3 is a plan view of the display device of FIG. 1.

FIG. 3 is a plan view of the display device of FIG. 1. Referring to FIG. 3, the display device DD may include a non-light emitting region NPXA and light-emitting regions PXA-R, PXA-G, and PXA-B. Each of the light-emitting regions PXA-R, PXA-G, and PXA-B may be a region in which the light generated from each of the light-emitting elements OEL (refer to FIG. 4) is emitted.

The light-emitting regions PXA-R, PXA-G, and PXA-B may be spaced apart from each other when viewed in plan. Each of the light-emitting regions PXA-R, PXA-G, and PXA-B may be a region divided by a pixel-defining layer PDL (refer to FIG. 4). The non-light emitting region NPXA may be region interposed between the neighboring light-emitting regions PXA-R, PXA-G, and PXA-B, and may be region corresponding to the pixel-defining layer PDL (refer to FIG. 4). The non-light emitting region NPXA may set the boundaries between the light-emitting regions PXA-R, PXA-G, and PXA-B, to prevent mixing the colors of light emitted from the light-emitting regions PXA-R, PXA-G, and PXA-B.

The light-emitting regions PXA-R, PXA-G, and PXA-B may be divided into a plurality of groups according to the color of light emitted onto the display device DD. The display device DD illustrated in FIG. 3 illustrates by way of example three light-emitting regions that respectively emit red light, green light, and blue light. For example, the display device DD may include a first light-emitting region PXA-R that emits red light, a second light-emitting region PXA-G that emits green light, and a third light-emitting region PXA-B that emits blue light.

The light-emitting regions PXA-R, PXA-G, and PXA-B in the display device DD may be arranged in a generally elongated (stripe) shape. Referring to FIG. 3, a plurality of first light-emitting regions PXA-R that emit red light, a plurality of second green light-emitting regions PXA-G that emit green light, and a plurality of third light-emitting regions PXA-B that emit blue light may be aligned respectively along the second direction DR2. In addition, the first light-emitting region PXA-R, the second light-emitting region PXA-G, and the third light-emitting region PXA-B may be alternately arranged in the order along the first direction DR1.

FIG. 3 illustrates that areas of the light-emitting regions PXA-R, PXA-G, and PXA-B are all similar, but embodiments are not limited thereto, and the areas of the light-emitting regions PXA-R, PXA-G, and PXA-B may be different from each other according to the wavelength region of the emitted light. The areas of the light-emitting regions PXA-R, PXA-G, and PXA-B may mean areas as viewed in a plane defined by the first direction DR1 and the second direction DR2.

The areas of the light-emitting regions PXA-R, PXA-G, and PXA-B may be different from each other. For example, in an embodiment, an area of a second light-emitting region PXA-G that emits green light may be smaller than an area of a third light-emitting region PXA-B that emits blue light, but the embodiments are not limited thereto.

The arrangement of the light-emitting regions PXA-R, PXA-G, and PXA-B is not limited as illustrated in FIG. 3. For example, the arrangement order of the first light-emitting region PXA-R, the second light-emitting region PXA-G, and the third light-emitting region PXA-B may be provided in various combinations depending on the required characteristics of display quality in the display device DD. For example, the light-emitting regions PXA-R, PXA-G, and PXA-B may be arranged in a matrix sold under the trade designation PenTile® by Samsung Display Co., Ltd, of Yongin-si, Republic of Korea or a diamond arrangement.

Figure 4:
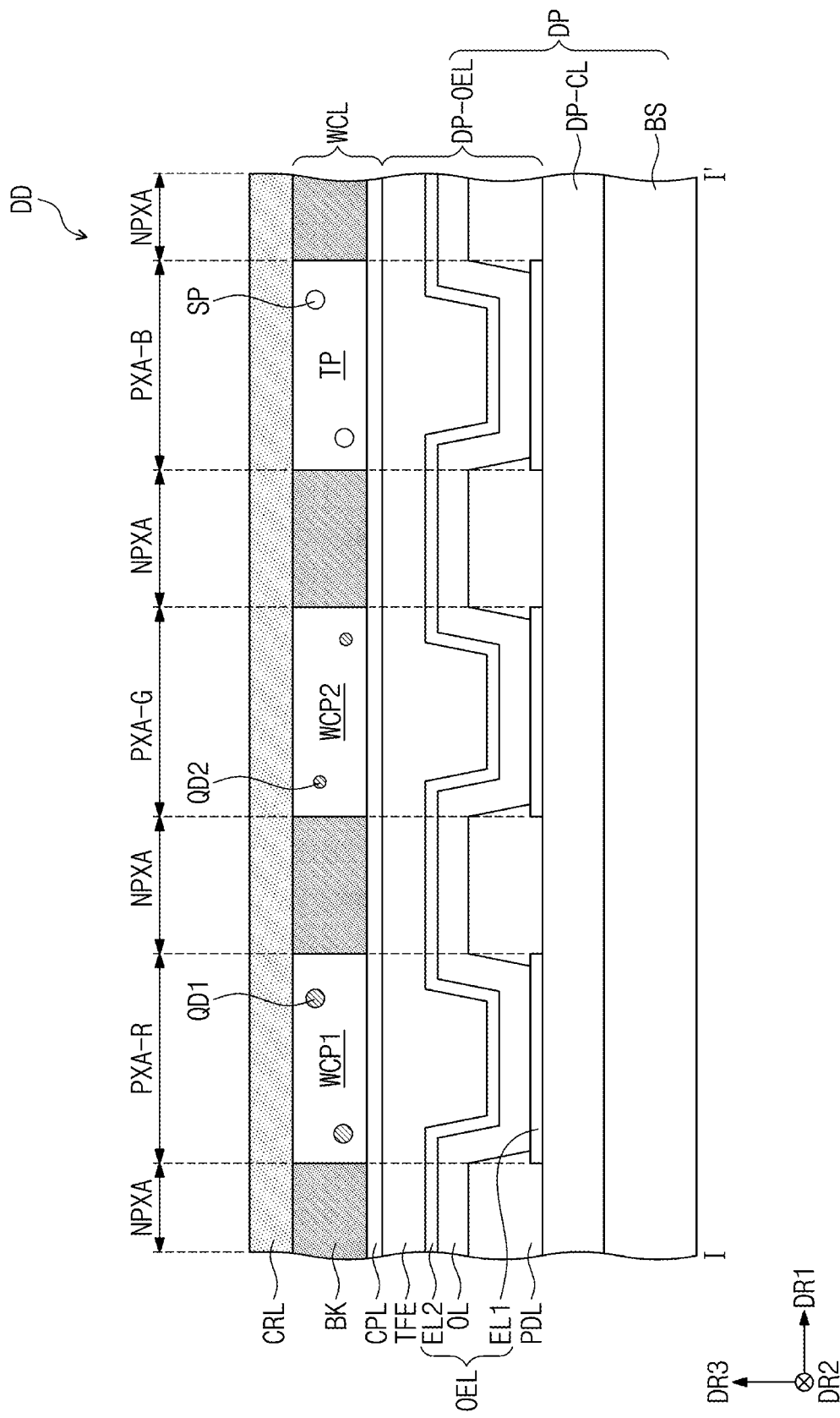
FIG. 4 is a cross-sectional view of a display device taken along line I-I' of FIG. 3.

FIG. 4 is a cross-sectional view of a display device taken along line I-I' of FIG. 3. The display device DD may include a display panel DP, a light control layer WCL, and a color correction layer CRL that are sequentially stacked. The display panel DP may include a base layer BS, a circuit layer DP-CL, and a light-emitting element layer DP-OEL that are sequentially stacked.

The color correction layer CRL may include an organic dye and a metal compound including at least one dithiolene moiety, such as a dithiolene-based metal compound. The organic dye included in the color correction layer CRL may improve the color gamut of light output from the display panel DP. The dithiolene-based metal compound included in the color correction layer CRL may improve the light stability of the organic dye. Even if the color correction layer CRL is exposed to light for a long time, the dithiolene-based metal compound may prevent the organic dye from being decomposed by light. Accordingly, due to the organic dye and the dithiolene-based metal compound included in the color correction layer CRL, even if exposed to light for a long time, the color correction layer CRL may have an effect of continuously improving the color gamut, and thus reliability of the color correction layer CRL may be improved. The color correction layer CRL is described in more detail below with reference to FIGS. 5 to 7.

The base layer BS included in the display panel DP may be rigid or flexible. The base layer BS may be a polymer substrate, a plastic substrate, a glass substrate, a metal substrate, a composite material substrate, or the like. The base layer BS may have a single layer structure as well as a multilayer structure. The base layer BS may include a synthetic resin film, and the base layer BS may have a multilayer structure including a plurality of synthetic resin film layers. The synthetic resin film may include one or more of a polyimide-based, an acrylic-based, a vinyl-based, an epoxy-based, a urethane-based, a cellulose-based, and a perylene-based resin, but the synthetic resin film material is not limited to the above examples.

The circuit layer DP-CL may be disposed on the base layer BS. The circuit layer DP-CL may include an insulating layer, a semiconductor pattern, a conductive pattern, a signal line, and the like. The circuit layer DP-CL may include a plurality of transistors formed of a semiconductor pattern, a conductive pattern, a signal line, and the like. The transistors may each include a control electrode, an input electrode, and an output electrode. For example, the circuit layer DP-CL may include a switching transistor and a driving transistor for driving a light-emitting element OEL. The light-emitting element layer DP-OEL may be disposed on the circuit layer DP-CL. The light-emitting element layer DP-OEL may include a pixel-defining layer PDL, the light-emitting element OEL, and an encapsulating layer TFE.

The light-emitting element OEL may include a first electrode EL1 and a second electrode EL2 that face each other, with an emission layer OL disposed between the first electrode EL1 and the second electrode EL2. The light-emitting element OEL may further include a hole transport region and an electron transport region. The light-emitting element OEL may include a hole transport region, an emission layer OL, and an electron transport region that are sequentially stacked.

The light-emitting element OEL may generate light by recombining holes and electrons injected from the first electrode EL1 and the second electrode EL2 in the emission layer OL. The light generated in the emission layer OL may be a first light having a specific wavelength range. For example, the first light may be blue light. The light-emitting element layer DP-OEL may provide the first light generated in the emission layer OL onto the light-emitting element layer DP-OEL.

The light-emitting element OEL is not limited to an organic light-emitting element, and may be a nano light-emitting element or a quantum dot light-emitting element. A light-emitting source included in the emission layer OL may be a nano material, a quantum dot, or a quantum rod, and the light-emitting element OEL may provide light by the light-emitting source included in the emission layer OL.

The pixel-defining layer PDL may be disposed on the circuit layer DP-CL. Certain openings may be defined in the pixel-defining layer PDL. The openings defined in the pixel-defining layer PDL may respectively overlap a plurality of light-emitting regions PXA-R, PXA-B, and PXA-G when viewed in plan. A non-light emitting region NPXA may be a region interposed between the neighboring light-emitting regions PXA-R, PXA-B, and PXA-G, and may be a region corresponding to the pixel-defining layer PDL.

The pixel-defining layer PDL may include an organic resin or an inorganic material. For example, the pixel-defining layer PDL may be formed including a polyacrylate-based resin, a polyimide-based resin, or a silicon nitride ($SiN_x$), a silicon oxide ($SiO_x$), a silicon oxynitride ($SiO_xN_y$), etc.

The encapsulating layer TFE may be disposed on the light-emitting element OEL and seal the light-emitting element OEL. The encapsulating layer TFE may function to protect the light-emitting element OEL from moisture and/or oxygen, and protect the light-emitting element OEL from foreign substances such as dust particles.

Although the encapsulating layer TFE is illustrated as a single layer in FIG. 4, it may include at least one an organic layer and an inorganic layer, or may include both the organic layer and the inorganic layer. For example, the encapsulating layer TFE may have a structure in which the organic layer and the inorganic layer are alternately stacked, or have a structure in which the inorganic layers and the organic layer disposed between the inorganic layers.

The inorganic layer included in the encapsulating layer TFE may include, for example, a silicon nitride layer, a silicon oxy nitride layer, a silicon oxide layer, a titanium oxide layer, an aluminum oxide layer, or the like, but the embodiments are not particularly limited to the above example. The organic layer included in the encapsulating layer TFE may include an acrylic organic film, but the embodiments are not particularly limited to the above example.

The light control layer WCL may be disposed on the display panel DP. The light control layer WCL may be disposed on the encapsulating layer TFE included in the display panel DP. An overcoat layer may be further disposed between the encapsulating layer TFE and the light control layer WCL. The overcoat layer may be a planarization layer or a buffer layer.

The light control layer WCL may include a plurality of light control portions WCP1 and WCP2, a transmitter in the form of a transmissive portion TP, a partition wall portion BK, and a capping layer CPL. The plurality of light control portions WCP1 and WCP2 and the transmissive portion TP may be disposed to be spaced apart from each other with the partition wall portion BK interposed therebetween. The capping layer CPL may be disposed below the plurality of light control portions WCP1 and WCP2, the transmissive portion TP, and the partition wall portion BK to cover the lower surface of the plurality of light control portions WCP1 and WCP2, the transmissive portion TP, and the partition wall portion BK.

The plurality of light control portions WCP1 and WCP2 may include a first light control portion WCP1 and a second light control portion WCP2, as illustrated in FIG. 4. Each of the plurality of light control portions WCP1 and WCP2 may include a base resin and quantum dots QD1 and QD2, and the quantum dots QD1 and QD2 may be included in the base resin in a dispersed form.

The quantum dots QD1 and QD2 included in each of the plurality of light control portions WCP1 and WCP2 may convert a first light provided by the light-emitting element layer DP-OEL into a light having a different wavelength range. The first light control portion WCP1 may include the first quantum dot QD1 configured to convert the first light into a second light having a different wavelength range. The second light control portion WCP2 may include the second quantum dot QD2 configured to convert the first light into a third light having a different wavelength range.

For example, the first light may be blue light. The first quantum dot QD1 included in the first light control portion WCP1 may convert blue light into red light. The second quantum dot QD2 included in the second light control portion WCP2 may convert blue light into green light. Accordingly, a first light-emitting region PXA-R corresponding to the first light control portion WCP1 may output red light, and a second light-emitting region PXA-G corresponding to the second light control portion WCP2 may output green light.

The quantum dots QD1 and QD2 that may be included in each of the plurality of light control portions WCP1 and WCP2 may be a semiconductor nanocrystal that may be selected from Groups II-VI compounds, Groups III-IV compounds, Groups III-V compounds, Groups IV-VI compounds, Group VI elements or compounds, Groups compounds, or a combination thereof.

Groups II-VI compounds may be selected from the group consisting of a binary compound selected from the group consisting of CdS, CdSe, CdTe, ZnS, ZnSe, ZnTe, ZnO, HgS, HgSe, HgTe, MgSe, MgS, and a mixture thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from the group consisting of CdZnSeS, CdZnSeTe, CdZnSTe, CdHgSeS, CdHgSeTe, CdHgSTe, HgZnSeS, HgZnSeTe, HgZnSTe, and a mixture thereof. Groups III-IV compounds may include a binary compound such as $In_2S_3$ and $In_2Se_3$, a ternary compound such as $InGaS_3$ and $InGaSe_3$, or any combination thereof.

Groups III-V compounds may be selected from the group consisting of a binary compound selected from the group consisting of GaN, GaP, GaAs, GaSb, AlN, AlP, AlAs, AlSb, InN, InP, InAs, InSb, and a mixture thereof; a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof; and a quaternary compound selected from the group consisting of GaAlNAs, GaAlNSb, GaAlPAs, GaAlPSb, GaAlNP, GaInNP, GaInNAs, GaInNSb, GaInPAs, GaInPSb, InAlNP, InAlNAs, InAlNSb, InAlPAs, InAlPSb, and a mixture thereof. Groups III-V semiconductor compounds may further include Group II metal such as InZnP.

Groups IV-VI compounds may be selected from the group consisting of a binary compound selected from the group consisting of SnS, SnSe, SnTe, PbS, PbSe, PbTe, and a mixture thereof; a ternary compound selected from the group consisting of SnSeS, SnSeTe, SnSTe, PbSeS, PbSeTe, PbSTe, SnPbS, SnPbSe, SnPbTe, and a mixture thereof; and a quaternary compound selected from the group consisting of SnPbSSe, SnPbSeTe, SnPbSTe, and a mixture thereof. Group IV elements may be selected from the group consisting of Si, Ge, and a mixture thereof. Group IV compounds may be a binary compound selected from the group consisting of SiC, SiGe, and a mixture thereof. Groups semiconductor compounds may include a ternary compound such as AgInS, $AgInS_2$, CuInS, $CuInS_2$, $CuGaO_2$, $AgGaO_2$, $AgAlO_2$, or any combination thereof.

In this case, a binary compound, a ternary compound, or a quaternary compound may be present in the particle at a uniform concentration, or may be present in the same particle while being divided to have partially different concentration distribution. The quantum dots QD1 and QD2 may have a core-shell structure including a core and a shell surrounding the core. In addition, they may have a core/shell structure in which one quantum dot surrounds another quantum dot. An interface between the core and the shell may have a concentration gradient such that a concentration of an element present in the shell gradually decreases toward the center of the interface.

Examples of the shell of the quantum dots QD1 and QD2 may include metal or non-metal oxide, a semiconductor compound, or a combination thereof. For example, a metal or non-metal oxide used in the shell may be illustrated as a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$ and NiO, or a ternary compound such as $MgAl_2O_4$, $CoFe_2O_4$, $NiFe_2O_4$ and $CoMn_2O_4$, but the embodiments are not limited thereto.

In addition, the semiconductor compound may be illustrated as, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but an embodiments are not limited thereto. The quantum dots QD1 and QD2 may control the color of emitted light according to the particle size, and thus, the quantum dots QD1 and QD2 may have various light-emitting colors such as green and red. The quantum dot may emit light in a shorter wavelength region as the particle size is smaller. For example, the particle size of the quantum dot emitting green light may be smaller than the particle size of the quantum dot emitting red light.

The transmissive portion TP may transmit the first light provided by the light-emitting element layer DP-OEL. For example, the transmissive portion TP may transmit blue light, and the third light-emitting region PXA-B corresponding to the transmissive portion TP may output blue light.

Referring to FIG. 4, the transmissive portion TP may include a light-transmissive resin, and may further include a scatterer SP dispersed in the light-transmissive resin. For example, the transmissive portion TP may include an acrylic resin, an imide resin, an epoxy resin, or the like. However, the light-transmissive resin included in the transmissive portion TP according to an embodiment has excellent dispersion properties for the scatterer SP, and may be applied as long as it is a material having transparency. The light-transmissive resin is not limited to any one of the above examples.

The scatterer SP dose not directly pass light output from the display panel DP to the transmissive portion TP in the third direction DR3, but may reflect in various directions in Lambertian reflection. That is, the scatterer SP may scatter light in various directions regardless of the incident angle of the light, without converting the wavelength range of the incident light. This allows the scatterer SP to improve side visibility of the light output from the display panel DP.

Without being limited to the embodiment illustrated in FIG. 4, at least one of the plurality of light control portions WCP1 and WCP2 may further include a scatterer SP. The scatterer SP may be dispersed in the resin included in each of the plurality of light control portions WCP1 and WCP2. The scatterer SP included in the plurality of light control portions WCP1 and WCP2 reflects light provided from the display panel DP in various directions, thereby increasing the probability of light incident to the quantum dots QD1 and QD2. This allows the scatterer SP included in the plurality of light control portions WCP1 and WCP2 to increase efficiency of the quantum dots QD1 and QD2 to convert a wavelength range.

The scatterer SP may include a light reflective material or a material having a refractive index different from the resins included in the plurality of light control portions WCP1 and WCP2 and the transmissive portion TP. For example, the scatterer SP may include a metal oxide or an organic material. The metal oxide may be a titanium oxide ($TiO_2$), a zirconium oxide ($ZrO_2$), an aluminum oxide ($Al_2O_3$) an indium oxide ($In_2O_3$), a zinc oxide (ZnO), a tin oxide ($SnO_2$), or the like, and the organic material may be an acrylic resin or an urethane resin. Accordingly, the scatterer SP may include materials that may form an optical interface with the resins included in the plurality of light control portions WCP1 and WCP2, and the transmissive portion TP, thereby partially scattering light, and the embodiments are not limited to any one particular configuration.

The partition wall portion BK may distinguish the boundary between the plurality of light control portions WCP1 and WCP2, and the transmissive portion TP. The partition wall portion BK may overlap the non-light emitting region NPXA when viewed in plan. The partition wall portion BK may prevent light leakage. For example, the partition wall portion BK may include an organic light-shielding material, a black pigment, a black dye, or the like.

As illustrated in FIG. 4, by way of examples, the capping layer CPL may be disposed below the light control portions WCP1 and WCP2, the transmissive portion TP, and the partition wall portion BK. the capping layer CPL may prevent the light control portions WCP1 and WCP2, and the transmissive portion TP from being exposed to moisture/oxygen.

The capping layer CPL may include an inorganic material. For example, the capping layer CPL may include a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, and a silicon oxynitride, or a metal thin film wherein light transmittance is secured. The capping layer CPL may further include an organic layer. The capping layer CPL may be composed of a single layer or a plurality of layers.

The color correction layer CRL may be disposed on the light control layer WCL. The color correction layer CRL may improve the color gamut of an image provided by the display panel DP and the light control layer WCL. In addition, even if the color correction layer CRL is exposed to light for a long time, the color correction layer CRL may maintain a degree of improvement in the color gamut. Further, the color correction layer CRL may protect the light control layer WCL and the display panel DP disposed below the color correction layer CRL.

The color correction layer CRL may include an organic dye and a dithiolene-based metal compound. The organic dye and the dithiolene-based metal compound may have high light absorption in a specific wavelength range.

The maximum absorption wavelength of the organic dye may be longer than the peak wavelength of green light output by the display panel DP and the light control layer WCL, and shorter than the peak wavelength of red light. For example, the maximum absorption wavelength of the organic dye may be about 580 nm to about 600 nm.

The maximum absorption wavelength herein means the wavelength of light at which a light-absorbing material has the maximum absorbance. The maximum absorption wavelength range means a wavelength range that includes the maximum absorption wavelength value of a material.

The organic dye included in the color correction layer CRL may have a molar extinction coefficient of about 10,000 ($10^4$) $M^{-1}cm^{-1}$ or more in the maximum absorption wavelength range. The molar extinction coefficient may affect light absorbance, and the molar extinction coefficient may vary depending on the type of material. For example, the organic dye included in the color correction layer CRL may have a molar extinction coefficient of about 10,000 ($10^4$) $M^{-1}cm^{-1}$ or more within a wavelength range of about 580 nm to about 600 nm, and thus, may absorb more light having a wavelength range of about 580 nm to about 600 nm than light having other wavelength ranges.

The organic dye may absorb light in a wavelength region where the wavelength of green light and the wavelength of red light overlap, thereby reducing light transmittance in the corresponding wavelength region. Among light output from the display panel DP and the light control layer WCL, light having a wavelength region where the wavelength of green light and the wavelength of red light overlap may have reduced transmittance while passing through the color correction layer. Accordingly, the peak shape of wavelengths of green light and red light output from the display device DD by the color correction layer CRL may become sharp, and thus, the color gamut of the display device DD may be improved.

The light absorbance of the organic dye may have a generally upwardly convex parabolic shape according to the wavelength range, with the maximum absorption wavelength being centered. A half-width herein means a difference in wavelength values which haves half of the maximum absorbance value in light absorbance according to the wavelength range. If the half-width of the light absorbance is small, light in a relatively narrow wavelength range may be absorbed, and if the half-width is large, light in a relatively wide wavelength range may be absorbed.

The organic dye may have a predetermined half-width in a wavelength region where the wavelengths of green light and red light overlap. For example, the half-width of the organic dye may be around 20 nm. The organic dye may thereby improve the color gamut of the display device DD by making the peak of the wavelength of green light and red light sharp without affecting the output of green light and red light of the display device DD. However, the half-width of the organic dye is not necessarily limited to the above value.

The light transmittance of the color correction layer CRL including the organic dye may be a value less than 1 in a specific wavelength range. For example, the light transmittance of the color correction layer CRL may be about 0.6 or less at a wavelength of about 580 nm to about 600 nm, and may be about 0.6 or more (close to 1) in a wavelength region other than about 580 nm to about 600 nm. The light transmittance of the color correction layer CRL is relatively lower in a wavelength region between the peak wavelength of green light and the peak wavelength of red light than that of other wavelength regions so that the color correction layer CRL may reduce the light transmittance in a region where the wavelengths of green light and red light overlap among the light provided by the display panel DP and the light control layer WCL. Accordingly, the color gamut of the display device DD may be improved.

The dithiolene-based metal compound may have high light absorption properties in the near-infrared region. The maximum absorption wavelength of the dithiolene-based metal compound may be longer than the peak wavelength of red light output by the display panel DP and the light control layer WCL. For example, the maximum absorption wavelength of the dithiolene-based metal compound may be about 700 nm or more.

The dithiolene-based metal compound may serve as a light stabilizer due to its stereochemical and electronic properties. The dithiolene-based metal compound may stabilize an electron that is destabilized by light, and thereby prevent the organic dye from being decomposed by light.

The maximum absorption wavelength range of the organic dye may not overlap the maximum absorption wavelength range of the metal compound. The organic dye may absorb in a wavelength region between green light and red light wavelengths, thereby improving the color gamut of green and red light, and the dithiolene-based metal compound may absorb light in the near-infrared region so that serves as a light stabilizer which enhances the light stability of the organic dye without affecting light in the visible light region output from the display device DD.

The organic dye may be included in an amount of about 0.1 wt % to about 10 wt % based on a total weight of the color correction layer CRL. The color correction layer CRL may include a base resin, an organic dye, and a metal compound. Here, the total weight of the color correction layer CRL may be the sum of the weights of the base resin, the organic dye, and the dithiolene-based metal compound included in the color correction layer CRL.

The color correction layer CRL may be formed by dissolving an organic dye in a base resin. However, if the content of the organic dye is too high, the organic dye may not be sufficiently dissolved in the base resin and may be aggregated. The aggregated organic dye may be visually recognized in the display device DD or may affect light transmittance of the display device DD.

The content of the dithiolene-based metal compound included in the color correction layer CRL may be smaller than the content of the organic dye. If the content of the metal compound is greater than the content of the organic dye, the degree of improvement in the color gamut by the organic dye may be reduced. The content of the dithiolene-based metal compound in the color correction layer CRL may be about 50% of the content of the organic dye. For example, the dithiolene-based metal compound may be included at about 0.1 wt % to about 10 wt %, based on the total weight of the color correction layer CRL.

The color correction layer CRL may include one or more organic dyes having the above-described maximum absorption wavelength range and molar extinction coefficient. For example, the one or more organic dyes included in the color correction layer CRL may be organic dyes having the same functional group but a different substituent, or organic dyes having a different functional group to each other.

An organic dye included in the color correction layer CRL may be, for example, at least one of an anthraquinone-based compound, a phthalocyanine-based compound, an azo-based compound, a perylene-based compound, a xanthene-based compound, a diimmonium-based compound, a dipyrromethene-based compound, a tetraazaporphyrin-based compound, a porphyrin-based compound, a squarylium-based compound, an oxazine-based compound, a triarylmethane-based compound, and a cyanine-based compound.

In particular, the organic dye included in the color correction layer CRL may be at least one compound including a squarylium moiety, such as a squarylium-based compound, having high absorption properties in a wavelength range of about 580 nm to about 600 nm. However, the organic dye may be included in the color correction layer CRL as long as a compound having high absorption properties in the above-described wavelength range included therein, and the organic dye is not necessarily limited to the above compounds.

A functional group means a specific atomic group or structure that plays an important role in determining the properties of a compound. A chromophore that causes color development may be included as one of the functional groups of the organic dye. For example, a functional group may include an anthraquinone, a phtalocyanine, an azo, a perylene, an xanthene, a diimmonium, a dipyrromethene, a tetraazaporphyrin, a porphyrin, a squarylium, an oxazine, a triarylmethane, a cyanine, and the like. A dye including a specific functional group structure may be referred to as a "specific functional group-based compound." For example, a compound including a squarylium structure may be referred to as a squarylium-based compound.

The dithiolene-based metal compound may include one or more metal compounds satisfying the above-described maximum absorption wavelength range. The dithiolene-based metal compound may include a bis(dithiobenzyl)-based compound which has a chelate ligand. The bis(dithiobenzyl)-based compound may include a transition metal such as copper, cobalt, and nickel as a central metal. The dithiolene-based metal compounds included in the color correction layer CRL may be one or more metal compounds which have different substituents or different central metals.

In particular, the dithiolene-based metal compound included in the color correction layer CRL may be a bis (dithiobenzil) nickel-based compound which has high absorption properties in a wavelength region of about 700 nm or more. However, the dithiolene-based metal compound is not necessarily limited to the above compound.

A polarizer layer, which is one of the optical functional layers, may be omitted in the display device DD The display device DD may omit the polarizer layer, thereby not only providing a relatively thinner display device compared with a display device including a polarizer layer, but also simplifying the manufacturing process of the display device. In addition, even if the polarizer layer is omitted, the display device DD may provide a display device with an improved color gamut by the color correction layer CRL.

Figure 5:
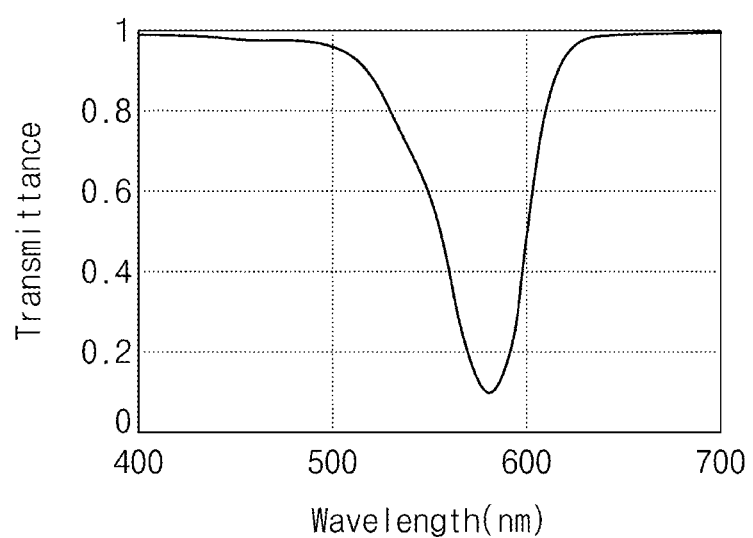
FIG. 5 is a graphical depiction of light transmittance according to wavelength of a color correction layer according to an embodiment constructed according to principles of the invention.
Figure 6A:
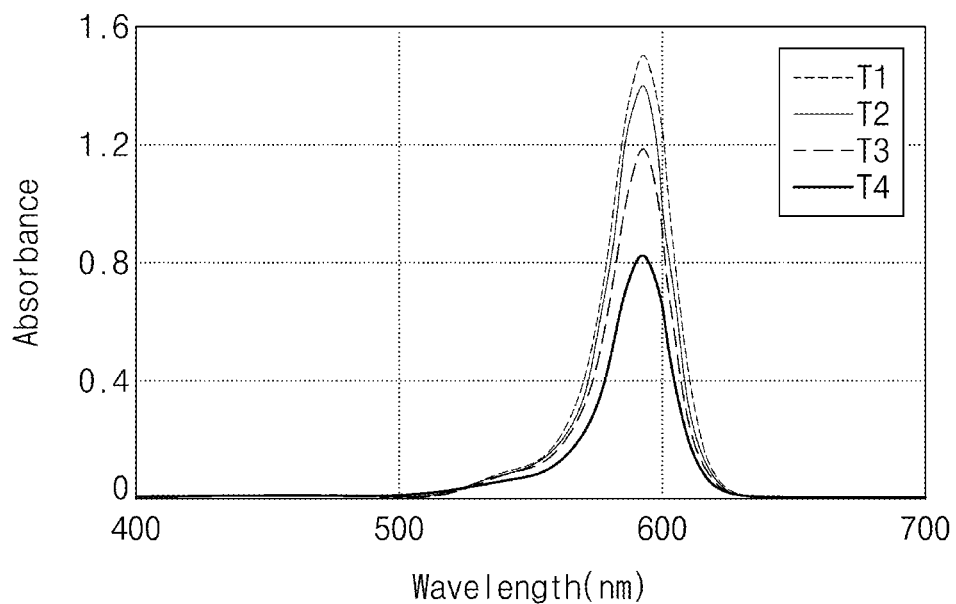
FIG. 6A is a graphical depiction of absorbance according to wavelength of a color correction layer of a Comparative Example.
Figure 6B:
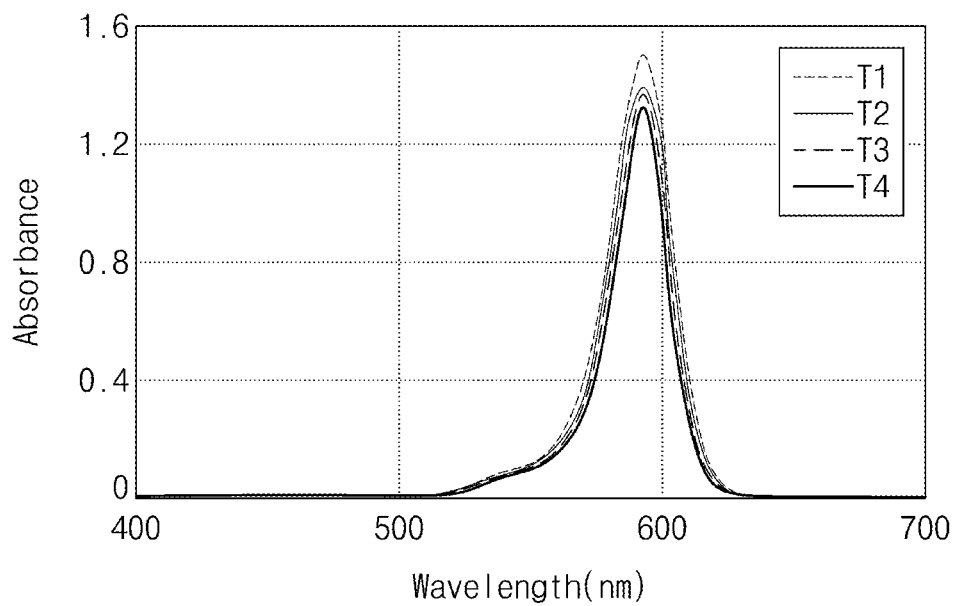
FIG. 6B is a graphical depiction of absorbance according to wavelength of a color correction layer of an Illustrative Example constructed according to principles of the invention.

FIG. 5 is a graphical depiction of light transmittance according to wavelength of a color correction layer according to an embodiment constructed according to principles of the invention. FIG. 6A is a graphical depiction of absorbance according to wavelength of a color correction layer of a Comparative Example. FIG. 6B is a graphical depiction of absorbance according to wavelength of a color correction layer of an Illustrative Example constructed according to principles of the invention.

FIG. 5 illustrates a graph of light transmittance according to wavelength of a color correction layer including a squarylium-based compound as an organic dye. The light transmittance graph of the color correction layer CRL including the organic dye has a downwardly convex parabolic shape in the wavelength range of about 500 nm to about 610 nm. The light transmittance of the color correction layer CRL according to an embodiment of the invention is about 0.6 or less in the wavelength range of about 550 nm to about 600 nm, and particularly, has a low value of about 0.2 or less in the wavelength range of around 580 nm. In this embodiment, the light transmittance of the color correction layer CRL may have a value close to 1 in the wavelength region other than about 500 nm to about 610 nm.

Therefore, with an organic dye having the maximum absorption wavelength range of about 580 nm to about 600 nm, the color correction layer CRL may reduce light transmittance in the wavelength region between green light and red light while having little impact on light transmittance at each peak wavelength of blue light, green light, and red light. This allows improvement in a color gamut of light transmitted through the color correction layer CRL.

FIG. 6A illustrates a graph of light absorbance according to a wavelength of a color correction layer including only an organic dye (hereinafter, a color correction layer of a Comparative Example). FIG. 6B illustrates a graph of a light absorbance according to a wavelength of a color correction layer including an organic dye and a dithiolene-based metal compound (hereinafter, a color correction layer of an Illustrative Example). T1 to T4 indicated in FIGS. 6A and 6B respectively represent changes in light absorbance over time the color correction layer is exposed to light in the ultraviolet region. That is, the time the color correction layer is exposed to light increases from T1 to T4.

Referring to FIGS. 6A and 6B, it can be seen that the color correction layer of the Comparative Example and the color correction layer of the Illustrative Example have the maximum absorbance in the wavelength range of about 580 nm to about 600 nm. In addition, comparing the light absorbance graph corresponding to T1, it can be seen that the color correction layer of the Comparative Example and the color correction layer of the Illustrative Example have almost the same light absorbance values. However, it can be seen through the graphs illustrated in FIGS. 6A and 6B that as the light exposure time increases, the light absorbance of the color correction layer of the Comparative Example and the light absorbance of the color correction layer of the Illustrative Example become different.

Referring to FIG. 6A, it can be seen that the light absorbance of the color correction layer of the Comparative Example decreases from T1 to T4 in the wavelength region of about 580 nm to about 600 nm. Accordingly, as the exposure time of the color correction layer to light increases, the organic dye may be decomposed by light, and as the organic dye is decomposed, the light absorbance of the color correction layer may be reduced in the maximum absorption wavelength range of the organic dye. That is, as the color correction layer of the Comparative Example which includes only an organic dye is exposed to light for a longer time, the effect of improving the color gamut by the organic dye may be reduced.

Referring to FIG. 6B, it can be seen that the light absorbance of the color correction layer of the Illustrative Example is maintained at a value of about 1.2 or more without significantly decreasing from T1 to T4 in the wavelength region of about 580 nm to about 600 nm. Accordingly, the dithiolene-based metal compound may serve as a light stabilizer to enhance the light stability of the organic dye, and even if the color correction layer is exposed to light for a long time, the organic dye may be prevented from being decomposed by light. That is, even if the color correction layer including the organic dye and the dithiolene-based metal compound is exposed to light for a long time, the effect of improving the color gamut by the organic dye is not significantly reduced, and reliability may be improved.

Figure 7:
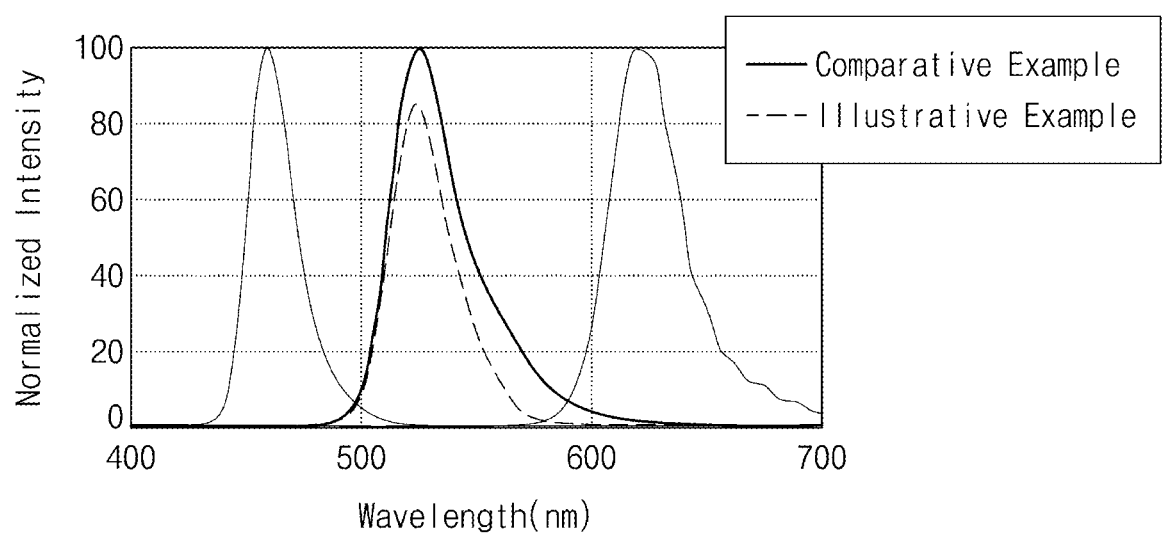
FIG. 7 is a graphical depiction of normalized intensity of light according to wavelengths of an Illustrative Example constructed according to principles of the invention described with respect to FIG. 4. and a Comparative Example.

FIG. 7 is a graphical depiction of normalized intensity of light according to wavelengths of an Illustrative Example constructed according to principles of the invention described with respect to FIG. 4. and a Comparative Example. The normalized intensity of light expressed by converting the intensity of light according to the wavelength into an integer value between 1 and 100. The display device of the Illustrative Example is a display device DD that includes a display panel DP, a light control layer WCL, and a color correction layer CRL illustrated in FIG. 3. The display device of the Comparative Example is a display device that does not include a color correction layer CRL in the display device DD illustrated in FIG. 3.

Referring to the graph of a thin solid line illustrated in FIG. 7, the normalized intensity of light of the Illustrative Example and the Comparative Example has almost the same value in the wavelength region of about 420 nm to about 510 nm corresponding to blue light and the wavelength region of about 590 nm to about 700 nm corresponding to red light. However, referring to the dotted line and the thick solid line graph illustrated in FIG. 7, the normalized intensity of light of the Illustrative Example and the Comparative Example represents a difference in the wavelength range of about 490 nm to about 610 nm corresponding to green light. That is, the normalized intensity of light of the Comparative Example and the Illustrative Example exhibits similar values in the blue light wavelength region and the red light wavelength region, and differ in the green light wavelength region.

When comparing the normalized intensity of light graph forms of the Illustrative Example and the Comparative example, it can be seen that the graph of the Illustrative Example narrower in the green light region. That is, the half-width of the light intensity of the Illustrative Example may be smaller than the half-width of the light intensity of the Comparative Example in the green light region. In addition, in the light intensity graph of the Illustrative Example, the portion where the green light region and the red light region overlap may be significantly reduced compared to the graph of the Comparative Example.

Accordingly, the organic dye included in the color correction layer may increase the light absorption of the color correction layer CRL in the wavelength range of about 580 nm to about 600 nm, and thus, the color light spectrum output from the display device has a small half-width in the green light wavelength range and has a sharp shape. In addition, the organic dye may reduce a region where the green wavelength region and the red wavelength region overlap. Accordingly, the display device DD including the color correction layer CRL may have an improved color gamut due to the organic dye.

The higher the color gamut, the more various colors may be expressed in colors that are close to nature. The color gamut of the display device DD including the color correction layer CRL is increased by about 110% based on the color gamut of the display device of the Comparative Example without the color correction layer CRL. Accordingly, a color correction layer CRL including an organic dye and a dithiolene-based metal compound may improve a color gamut of a display device DD and provide the display device DD with improved reliability to a user.

The color correction layer included in display devices constructed according to the principles and embodiments of the invention may include an organic dye and a dithiolene-based metal compound. The color correction layer may include an organic dye having the maximum absorption wavelength range longer than a peak wavelength of green light and shorter than a peak wavelength of red light to improve a color gamut of a display device. The color correction layer may include a dithiolene-based metal compound which serves as a light stabilizer, so that the effect of improving the color gamut may be maintained even if the display device is exposed to light for a long time. In addition, the maximum absorption wavelength range of the dithiolene-based metal compound is included in the near-infrared region, which is a longer wavelength than the peak wavelength of red light, and thus, the dithiolene-based metal compound may serve as a light stabilizer without affecting light absorption in the visible light region. That is, the dithiolene-based metal compound may not reduce the color gamut of an image provided by the display device.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a display panel including a light-emitting element to provide a first light;

a light control layer disposed on the display panel; and
a color correction layer disposed on the light control layer,
wherein the color correction layer comprises an organic dye and a metal compound comprising at least one dithiolene moiety, a maximum absorption wavelength of the organic dye about 580 nm to about 600 nm, and a maximum absorption wavelength of the metal compound about 700 nm or more.

2. The display device of claim 1, wherein a range of the maximum absorption wavelength of the organic dye does not overlap a range of the maximum absorption wavelength of the metal compound.

3. The display device of claim 1, wherein a light transmittance of the color correction layer is about 0.6 or less at a wavelength of about 580 nm to about 600 nm.

4. The display device of claim 1, wherein a molar extinction coefficient at the maximum absorption wavelength of the organic dye is about 10,000 $M^{-1}cm^{-1}$ or more.

5. The display device of claim 1, wherein a content of the metal compound is less than a content of the organic dye in the color correction layer.

6. The display device of claim 1, wherein the organic dye is included in an amount of about 0.1 wt % to about 10 wt %, based on a total weight of the color correction layer.

7. The display device of claim 1, wherein the metal compound is included in an amount of about 0.1 wt % to about 5 wt %, based on a total weight of the color correction layer.

8. The display device of claim 1, wherein the organic dye comprises at least one compound comprising a squarylium moiety.

9. The display device of claim 1, wherein the metal compound comprises at least one bis(dithiobenzil) nickel-based compound.

10. The display device of claim 1, wherein the light-emitting element includes an organic light-emitting element, a nano light-emitting element, or a quantum dot light-emitting element.

11. The display device of claim 1, wherein the light control layer including:
a first light control portion comprising a first quantum dot to convert the first light into a second light having a different wavelength range;
a second light control portion comprising a second quantum dot to convert the first light into a third light having a different wavelength range; and
a transmissive portion to transmit the first light.

12. The display device of claim 11, further comprising a scatterer in at least one of the first light control portion, the second light control portion, and the transmissive portion.

13. The display device of claim 1, wherein the display panel is a flexible display panel.

14. A display device comprising:
a light-emitting element layer to provide blue light;
a light control layer disposed on the light-emitting element layer; and
a color correction layer disposed on the light control layer,
wherein the light control layer comprises a first light control portion including a first quantum dot to convert the blue light to green light;
a second light control portion including a second quantum dot to convert the blue light to red light; and
a transmissive portion to transmit the blue light, and
the color correction layer comprises an organic dye and a metal compound comprising at least one dithiolene moiety, wherein a maximum absorption wavelength of the organic dye is longer than a peak wavelength of the green light, and a maximum absorption wavelength of the metal compound is longer than a peak wavelength of the red light.

15. The display device of claim 14, wherein a range of the maximum absorption wavelength of the organic dye does not overlap a range of the maximum absorption wavelength of the metal compound.

16. The display device of claim 14, wherein the maximum absorption wavelength of the organic dye is longer than the peak wavelength of the green light and shorter than the peak wavelength of the red light.

17. The display device of claim 14, wherein a molar extinction coefficient at the maximum absorption wavelength of the organic dye is about 10,000 $M^{-1}cm^{-1}$ or more.

18. The display device of claim 14, wherein a content of the metal compound is about 50% or less of a content of the organic dye in the color correction layer.

19. The display device of claim 14, wherein the organic dye is included in an amount of about 0.1 wt % to about 10 wt % and the metal compound is included in an amount of about 0.1 wt % to about 5 wt %, based on a total weight of the color correction layer.

20. The display device of claim 14, wherein the organic dye comprises at least one squarylium-based compound, and the metal compound comprises at least one bis(dithiobenzil) nickel-based compound.

21. An electronic device comprises a display device, wherein
the display device comprises:
a display panel including a light-emitting element to provide a first light;
a light control layer disposed on the display panel; and
a color correction layer disposed on the light control layer, and
the color correction layer comprises an organic dye and a metal compound comprising at least one dithiolene moiety, a maximum absorption wavelength of the organic dye is about 580 nm to about 600 nm, and a maximum absorption wavelength of the metal compound is about 700 nm or more.

* * * * *